US012787207B2

(12) United States Patent
Hogan et al.

(10) Patent No.: US 12,787,207 B2
(45) **Date of Patent: *Nov. 3, 2026**

(54) CABLE MANAGEMENT SYSTEM FOR A SERVER RACK

(71) Applicant: Dell Products L.P., Round Rock, TX (US)

(72) Inventors: Jordan C. Hogan, Austin, TX (US); Yi-Hsuan Chen, Taoyuan City (TW)

(73) Assignee: Dell Products L.P., Round Rock, TX (US)

(*) Notice: Subject to any disclaimer, the term of this patent is extended or adjusted under 35 U.S.C. 154(b) by 146 days.

This patent is subject to a terminal disclaimer.

(21) Appl. No.: 18/825,280

(22) Filed: Sep. 5, 2024

(65) Prior Publication Data

US 2024/0431064 A1 Dec. 26, 2024

Related U.S. Application Data

(63) Continuation of application No. 18/049,844, filed on Oct. 26, 2022, now Pat. No. 12,133,351.

(51) Int. Cl.
*H05K 7/14* (2006.01)

(52) U.S. Cl.
CPC ......... *H05K 7/1491* (2013.01); *H05K 7/1489* (2013.01)

(58) Field of Classification Search
USPC ........................................ 312/223.2
See application file for complete search history.

(56) References Cited

U.S. PATENT DOCUMENTS 6,305,556 B1 * 10/2001 Mayer .................. G06F 1/18 361/679.01
6,327,139 B1 * 12/2001 Champion ........... H05K 7/1491 174/72 A
6,646,893 B1 * 11/2003 Hardt .................. H05K 7/1491 361/752
6,747,874 B2 * 6/2004 McKinnon ........... H05K 7/1491 312/298
6,840,388 B2 * 1/2005 Mayer .................. H05K 7/1491 211/26
7,026,551 B2 * 4/2006 Franz .................. H05K 7/1448 174/72 A (Continued)

*Primary Examiner* — Daniel J Troy
*Assistant Examiner* — Timothy M Ayres
(74) *Attorney, Agent, or Firm* — McDermott Will & Schulte LLP

(57) ABSTRACT

A cable management system for a server rack, including an adapter bracket coupled to the server rack; a rail assembly coupled to the adapter bracket, the rail assembly including a plurality of apertures; a cable management apparatus slideably coupled to the rail assembly, the cable management apparatus including: a plunger; a plurality of tabs; and a plurality of retention devices, wherein, when the cable management apparatus is coupled to the rail assembly, the plunger extends through one of the apertures to define a position of the cable management apparatus with respect to the rail assembly such that one or more cables of the server rack are positioned between opposing tabs of the plurality of tabs and coupled to the cable management apparatus by one or more of the retention devices.

19 Claims, 14 Drawing Sheets

(56) References Cited

U.S. PATENT DOCUMENTS

| | | | | |
|---|---|---|---|---|
| 7,092,258 | B2 * | 8/2006 | Hardt | H02B 1/36 361/826 |
| 7,097,047 | B2 * | 8/2006 | Lee | H05K 7/1491 361/825 |
| 7,258,583 | B1 * | 8/2007 | Baiza | H02G 11/006 174/72 A |
| 7,570,860 | B2 * | 8/2009 | Smrha | G02B 6/4455 385/134 |
| 7,703,734 | B2 * | 4/2010 | Chen | A47B 88/43 312/351 |
| 7,780,253 | B1 * | 8/2010 | Lu | H05K 7/183 312/334.4 |
| 7,988,246 | B2 * | 8/2011 | Yu | A47B 88/43 211/175 |
| 8,033,621 | B2 * | 10/2011 | Liang | H05K 7/1489 312/334.4 |
| 8,083,298 | B2 * | 12/2011 | Henderson | H05K 7/1489 312/334.4 |
| 8,326,107 | B2 * | 12/2012 | Cooke | G02B 6/44526 385/135 |
| 8,403,434 | B2 * | 3/2013 | Yu | H05K 7/1489 312/334.44 |
| 8,607,993 | B2 * | 12/2013 | Williams | A47B 88/43 211/26 |
| 8,678,524 | B2 * | 3/2014 | Green | H05K 7/1489 312/319.1 |
| 8,770,528 | B2 * | 7/2014 | Chen | A47B 96/06 248/220.21 |
| 9,375,087 | B1 * | 6/2016 | Chen | H05K 7/1489 |
| 9,402,329 | B1 * | 7/2016 | Chen | H02G 11/00 |
| 9,769,947 | B1 * | 9/2017 | Sands | H05K 7/1491 |
| 10,117,351 | B2 * | 10/2018 | Chen | H05K 7/1491 |
| 10,182,651 | B2 * | 1/2019 | Jost | A47B 96/06 |
| 10,736,230 | B2 * | 8/2020 | Chen | H05K 7/1489 |
| 10,813,242 | B2 * | 10/2020 | Geng | H05K 7/16 |
| 11,382,234 | B2 * | 7/2022 | Chen | H05K 7/1491 |
| 11,483,945 | B2 * | 10/2022 | Gundogan | H05K 7/1491 |
| 12,133,351 | B2 * | 10/2024 | Hogan | H05K 7/1489 |
| 2004/0164208 | A1 * | 8/2004 | Nielson | H02G 11/00 248/49 |
| 2022/0125198 | A1 * | 4/2022 | Hancock | H05K 7/1489 |

* cited by examiner

CABLE MANAGEMENT SYSTEM FOR A SERVER RACK

BACKGROUND

Field of the Disclosure

The disclosure relates generally to a cable management system for a server rack.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a cable management system for a server rack, including an adapter bracket coupled to the server rack; a rail assembly coupled to the adapter bracket, the rail assembly including a plurality of apertures; a cable management apparatus slideably coupled to the rail assembly, the cable management apparatus including: a plunger; a plurality of tabs; and a plurality of retention devices, wherein, when the cable management apparatus is coupled to the rail assembly, the plunger extends through one of the apertures to define a position of the cable management apparatus with respect to the rail assembly such that one or more cables of the server rack are positioned between opposing tabs of the plurality of tabs and coupled to the cable management apparatus by one or more of the retention devices.

Other embodiments of these aspects include corresponding systems and apparatus.

These and other embodiments may each optionally include one or more of the following features. For instance, the rail assembly includes a first side positioned opposite to a second side, the first side including the plurality of apertures; top side including an opening; and a rail side, including a slot extending a length of the rail side and defining a first segment and a second segment on the rail side.

The cable management apparatus further includes a pair of flanges extending from a first end of the cable management apparatus; the plunger coupled thru a first flange of the pair of flanges; and a coupling element coupled to the first end of the cable management apparatus and extending away from the first end, the coupling element including a stub, wherein a gap is defined between the stub and the first end. The slot of the rail side includes a flared opening at the top side of the rail assembly. When the cable management apparatus is coupled to the rail assembly, i) the coupling element is positioned within the slot of the rail side of the rail assembly through the flared opening at the top side of the rail assembly such that a portion of the first segment and the second segment are positioned within the gap of the coupling element and ii) the plunger extends through one of the apertures to define the position of the cable management apparatus with respect to the rail assembly. The rail assembly further includes a coupling side that is coupled to the adapter bracket, the coupling side opposite to the rail side. The rail assembly includes a first member and a second member, the first member coupled to the second member, wherein the second member includes the rail side and the first member includes the coupling side. Both the first member and the second member include the plurality of apertures. The retention devices includes hook-and-loop members. The rail assembly further includes a bottom side opposite to the top side, the bottom side including an additional opening, wherein the slot of the rail side includes an additional flared opening at the bottom side of the rail assembly. Further including an additional adapter bracket coupled to the server rack; an additional rail assembly coupled to the additional adapter bracket, the additional rail assembly including a plurality of additional apertures; an additional cable management apparatus slideably coupled to the additional rail assembly, the additional cable management apparatus including: an additional plunger; a plurality of additional tabs; and a plurality of additional retention devices, wherein, when the additional cable management apparatus is coupled to the additional rail assembly, the additional plunger extends through one of the additional apertures to define a position of the additional cable management apparatus with respect to the additional rail assembly such that the one or more cables of the server rack are positioned between opposing additional tabs of the plurality of additional tabs and coupled to the additional cable management apparatus by one or more of the additional retention devices. The position of the cable management apparatus and the position of the additional cable management apparatus are substantially the same. The one or more cables are hoses.

Innovative aspects of the subject matter described in this specification may be embodied in a cable management system for a server rack, including a rail assembly, comprising: a first side positioned opposite to a second side, the first side including a plurality of apertures; a top side including an opening; and a rail side, including a slot extending a length of the rail side and defining a first segment and a second segment of the rail side; a cable management apparatus, comprising: a pair of flanges extending from a first end of the cable management apparatus; a plunger coupled thru a first flange of the pair of flanges; and a coupling element coupled to the first end of the cable management apparatus and extending away from the first end, the coupling element including a stub, wherein a gap is defined between the stub and the first end; wherein when the cable management apparatus is coupled to the rail assembly, i) the coupling element is positioned within the slot of the rail side of the rail assembly through the opening of the top side of the rail assembly such that a portion of the first segment and the second segment are positioned within the gap of the coupling element and ii) the plunger extends through one of the apertures to define a position of the cable management apparatus with respect to the rail assembly.

Other embodiments of these aspects include corresponding systems and apparatus.

These and other embodiments may each optionally include one or more of the following features. For instance, the rail assembly further includes a coupling side that is coupled to the adapter bracket, the coupling side opposite to the rail side. The retention devices includes hook-and-loop members. The slot of the rail side includes a flared opening at the top side of the rail assembly, and the rail assembly further includes a bottom side opposite to the top side, the bottom side including an additional opening, wherein the slot of the rail side includes an additional flared opening at the bottom side of the rail assembly. The rail assembly includes a first member and a second member, the first member coupled to the second member, wherein the second member includes the rail side and the first member includes the coupling side. Both the first member and the second member include the plurality of apertures. The one or more cables are hoses.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
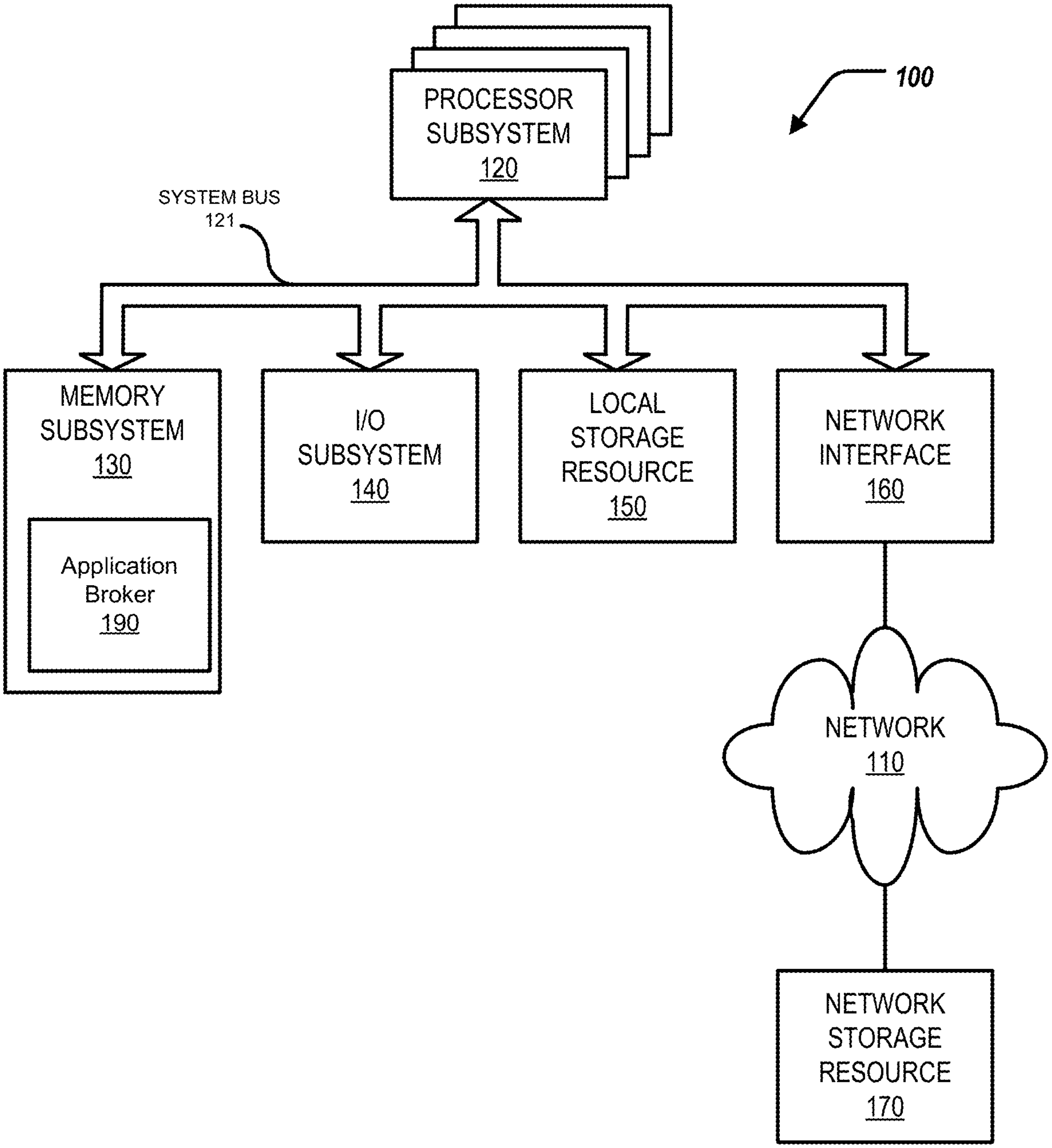
FIG. 1 is a block diagram of selected elements of an embodiment of an information handling system.

This disclosure discusses a cable management system for a server rack, including an adapter bracket coupled to the server rack; a rail assembly coupled to the adapter bracket, the rail assembly including a plurality of apertures; a cable management apparatus slideably coupled to the rail assembly, the cable management apparatus including: a plunger; a plurality of tabs; and a plurality of retention devices, wherein, when the cable management apparatus is coupled to the rail assembly, the plunger extends through one of the apertures to define a position of the cable management apparatus with respect to the rail assembly such that one or more cables of the server rack are positioned between opposing tabs of the plurality of tabs and coupled to the cable management apparatus by one or more of the retention devices.

Specifically, a server rack can include multiple servers. The servers may be liquid cooled, with multiple hoses running on the back of the server rack to provide such cooling. However, components at the back of the server rack may need to be accessed as well. A cable management system can be coupled to the server rack to provide a proper positioning of such hoses so that the components can be accessed.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-12 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (ISCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, a server rack can include multiple servers (or information handling systems such as the information handling system 100). The servers may be liquid cooled, with multiple hoses running on the back of the server rack to provide such cooling. However, components at the back of the server rack may need to be accessed as well. A cable management system can be coupled to the server rack to provide a proper positioning of such hoses so that the components can be accessed.

Figure 2:
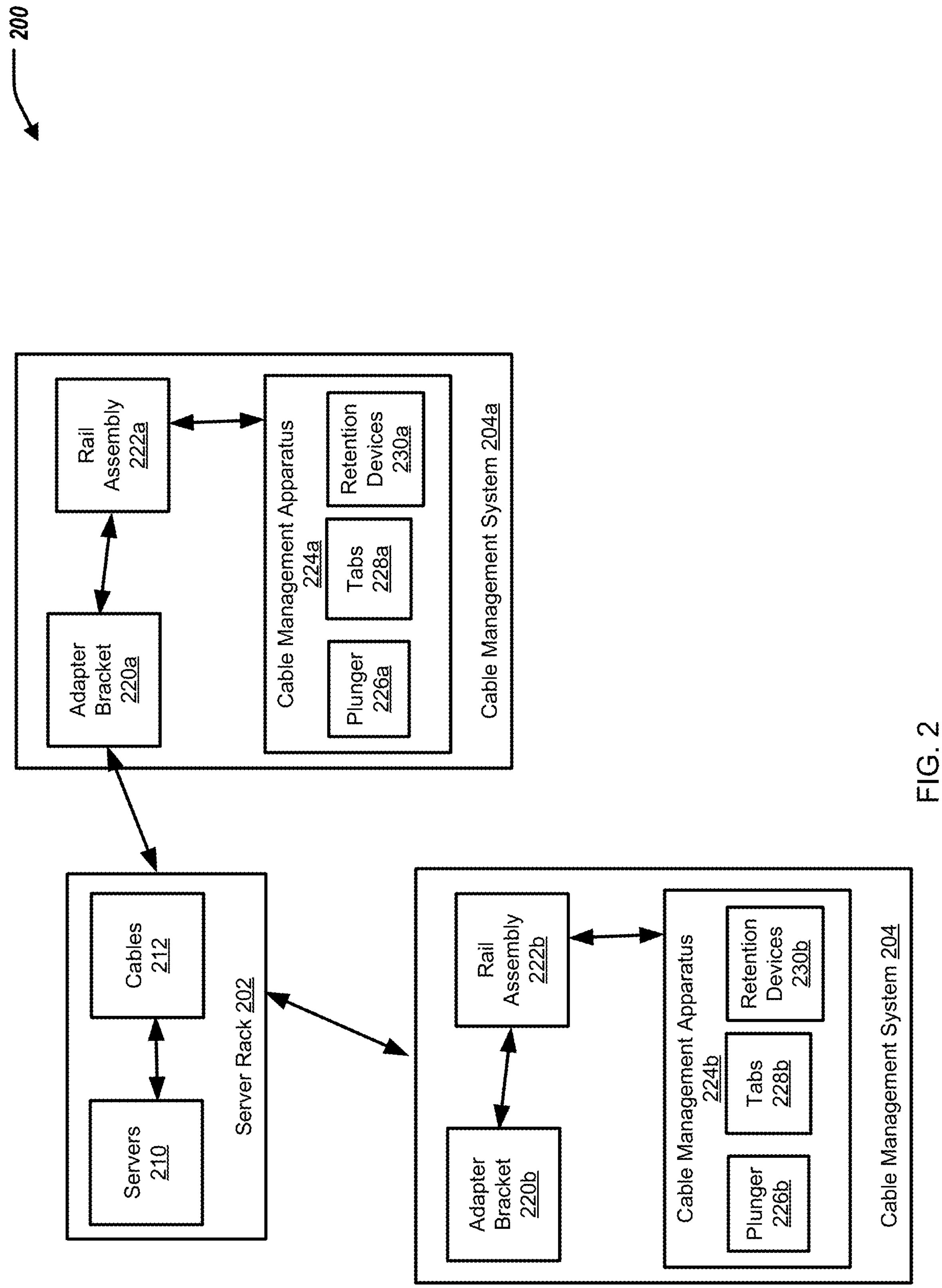
FIG. 2 illustrates a block diagram of an environment including a server rack, a first cable management system, and a second cable management system.

Turning to FIG. 2, FIG. 2 illustrates an environment 200 including a server rack 202, a first a cable management system 204*a*, and a second cable management system 204*b*. The server rack 202 can also include servers 210 and cables 212. The servers 210 can be similar to, or include, the information handling system 100 of FIG. 1. The first cable management system 204*a* can include an adapter bracket 220*a*, a rail assembly 222*a*, and a cable management apparatus 224*a*. The cable management apparatus 204*a* can include a plunger 226*a*, tabs 228*a*, and retention devices 230*a*.

The second cable management system 204*b* can include an adapter bracket 220*b*, a rail assembly 222*b*, and a cable management apparatus 224*b*. The cable management apparatus 204*b* can include a plunger 226*b*, tabs 228*b*, and retention devices 230*b*. The cable management systems 204*a*, 204*b* can be collectively referred to as cable management systems 204. The adapter brackets 220*a*, 220*b* can be collectively referred to as adapter brackets 220. The rail assembly 222*a*, 222*b* can be collectively referred to as rail assemblies 222. The cable management apparatus 224*a*, 224*b* can be collectively referred to as cable management apparatuses 224. The plungers 226*a*, 226*b* can be collectively referred to as plungers 226. The tabs 228*a*, 228*b* can be collectively referred to as tabs 228. The retention devices 230*a*, 230*b* can be collectively referred to as retention devices 230.

In some examples, the cable management system 204 can include any number of cable management apparatuses 224.

Figure 3:
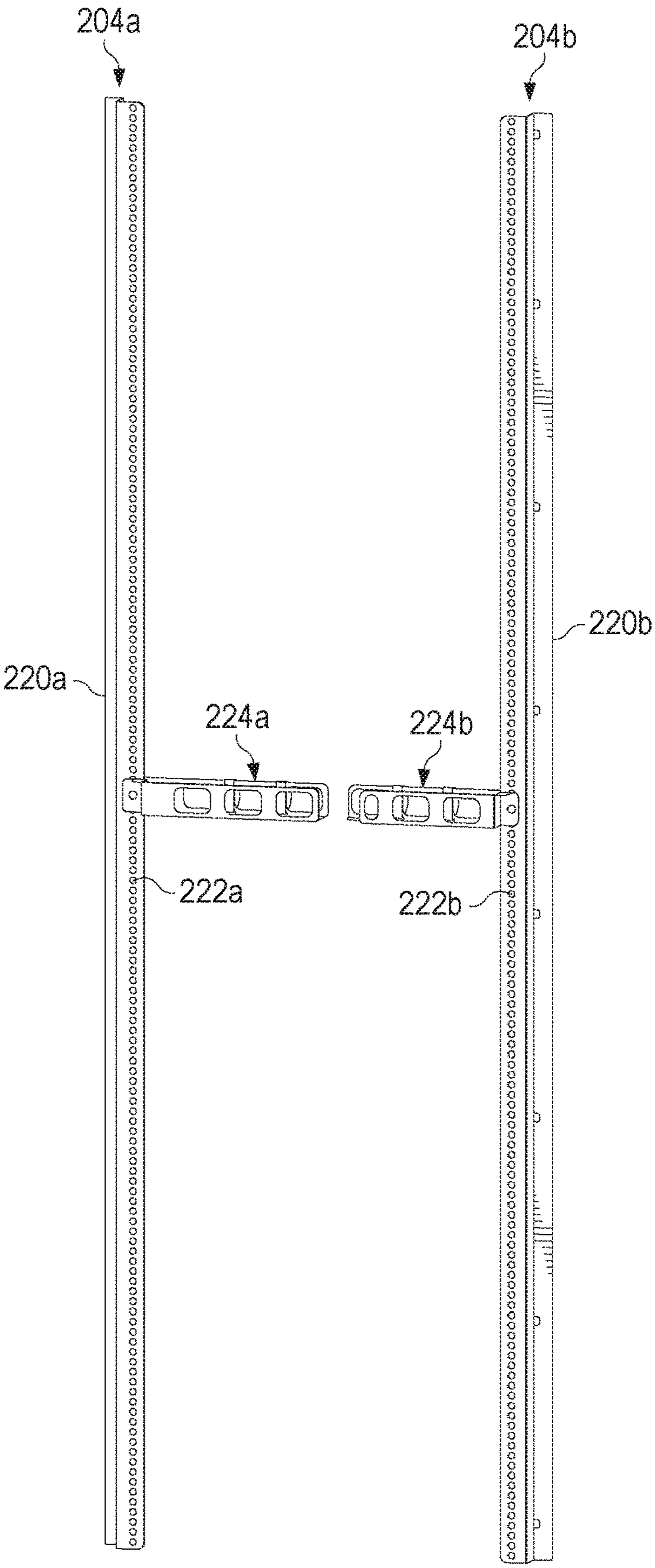
FIG. 3 illustrates a perspective view of the first cable management system and the second cable management system.

FIG. 3 illustrates a perspective view of the first cable management system 204*a* and the second cable management system 204*b*. As illustrated, the rail assembly 222*a* is coupled to the adapter bracket 220*a*; and the cable management apparatus 224*a* is coupled to the rail assembly 222*a*. Further, the cable management apparatus 224*a* is coupled to the rail assembly 222*a*; and the cable management apparatus 224*b* is coupled to the rail assembly 222*b*.

Figure 4:
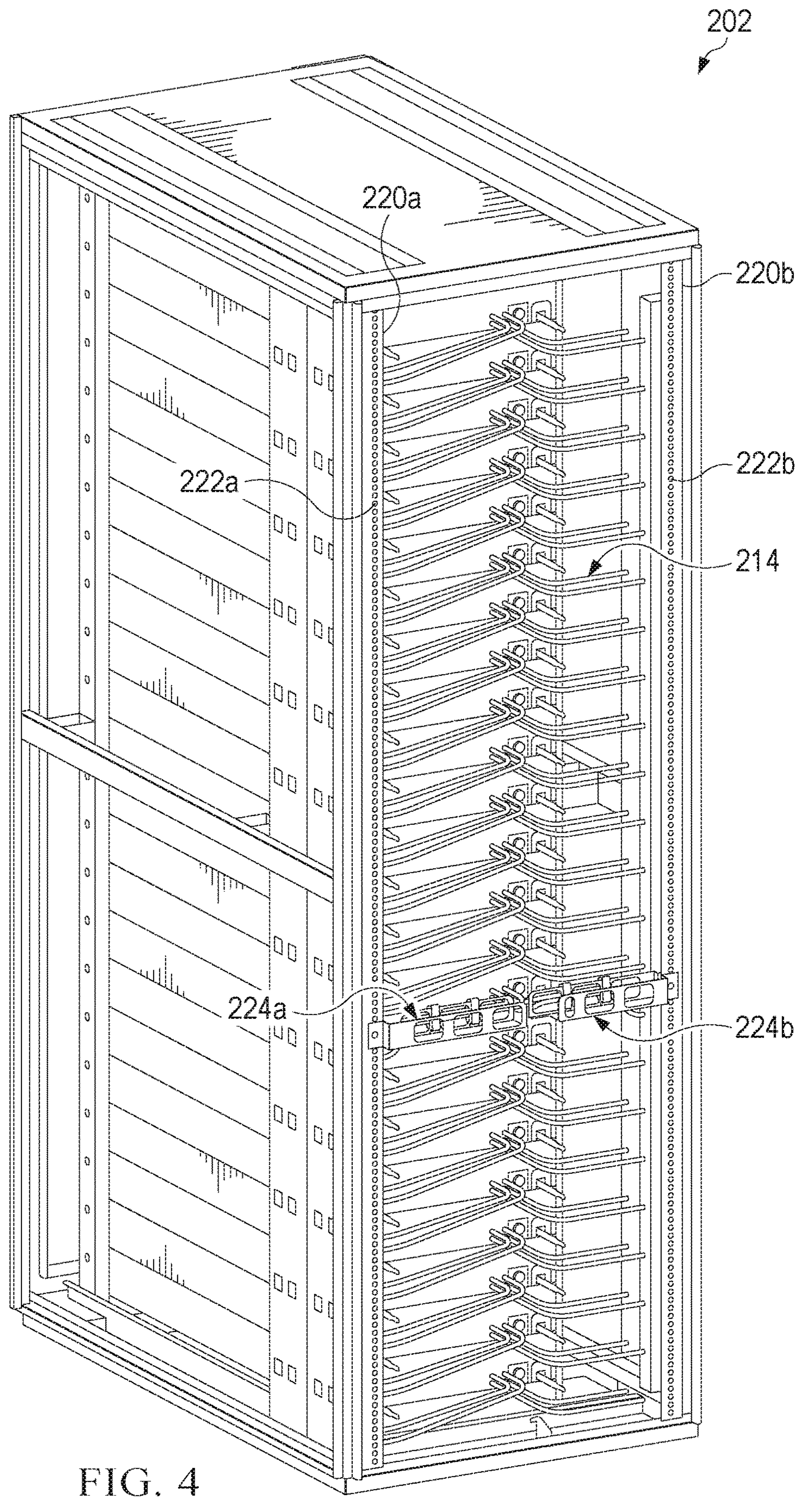
FIG. 4 illustrates a perspective view of the cable management systems coupled to the server rack.

FIG. 4 illustrates a perspective view of the cable management systems 204 coupled to the server rack 202. In particular, the adapter bracket 220*a* is coupled to the server rack 202; the rail assembly 222*a* is coupled to the adapter bracket 220*a*; and the cable management apparatus 224*a* is coupled to the rail assembly 222*a*. Further, the adapter bracket 220*b* is coupled to the server rack 202; the rail assembly 222*b* is coupled to the adapter bracket 220*b*; and the cable management apparatus 224*b* is coupled to the rail assembly 222*b*.

Figure 5:
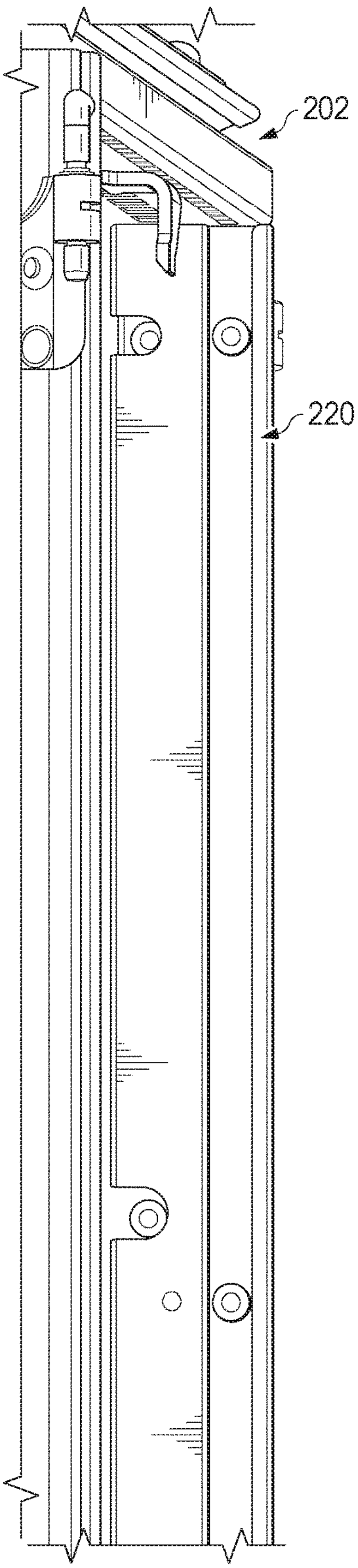
FIG. 5 illustrates a perspective view of the adapter bracket.

FIG. 5 illustrates a perspective view of the adapter bracket 220. In particular, the adapter bracket 220 is shown coupled to the server rack 202.

Figure 6:
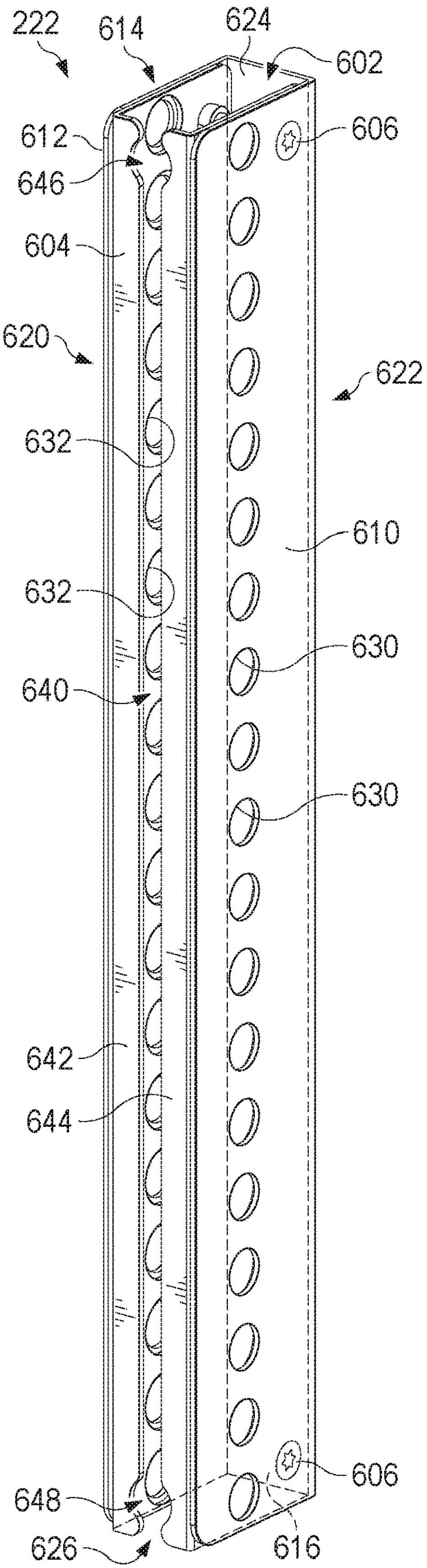
FIG. 6 illustrates a perspective view of the rail assembly.

FIG. 6 illustrates a perspective view of the rail assembly 222. As illustrated, the rail assembly 222 includes a first member 602 and a second member 604. The first member 602 can be coupled to the second member 604 with one or more fasteners 606 at one or more locations. However, in some examples, the rail assembly 222 is formed from one congruent member. In some examples, the rail assembly 222 is formed from sheet metal.

The rail assembly 222 can include a first side 610 positioned opposite to a second side 612. The rail assembly 222 can include a top side 614 and a bottom side 616 opposite to the top side 614. The rail assembly 222 can include a rail side 620 and a coupling side 622, the coupling side 622 opposite to the rail side 620. In some examples, the first member 602 includes the coupling side 622 and the second member 604 includes the rail side 620. The coupling side 622 can be coupled to the adapter bracket 220, as shown in FIGS. 3 and 4.

The top side 614 includes an opening 624. The bottom side 616 can include an additional opening 626. The rail assembly 222, and in particular, the first side 610, can include a plurality of apertures 630. In some examples, the second side 612 also includes apertures 632. In some examples, the first member 602 and the second member 604 both include the plurality of apertures 630, 632.

The rail side 620 can include a slot 640 extending a length of the rail side 620. The slot 640 can define a first segment 642 and a second segment 644 on the rail side 620. The slot 640 can further include a flared opening 646 proximate to the top side 614 of the rail assembly 222. Further, the slot 640 can also include a flared opening 648 proximate to the bottom side 616 of the rail assembly 222.

Figure 7A:
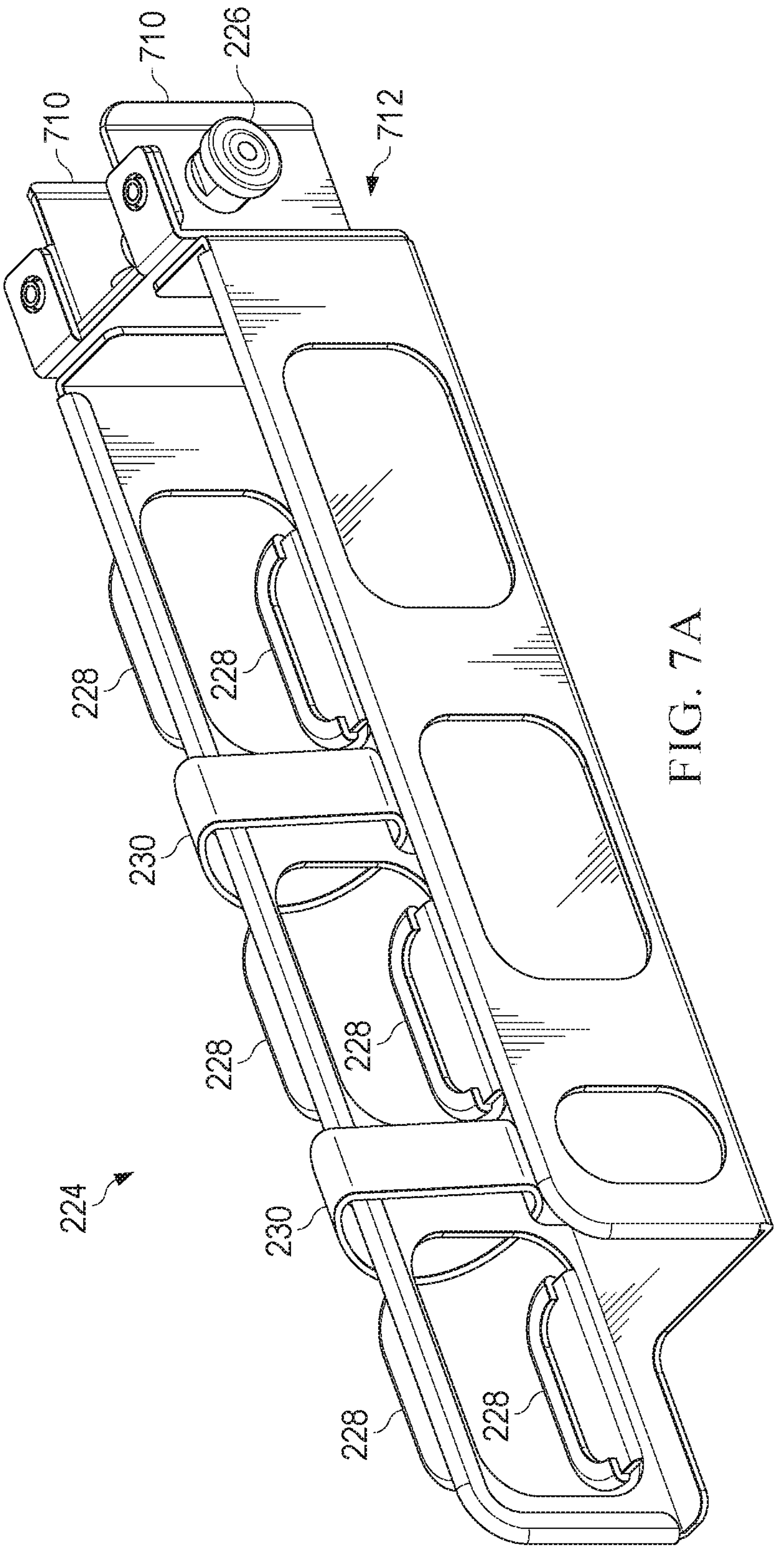
FIGS. 7A, 7B illustrates the cable management apparatus.
Figure 7B:
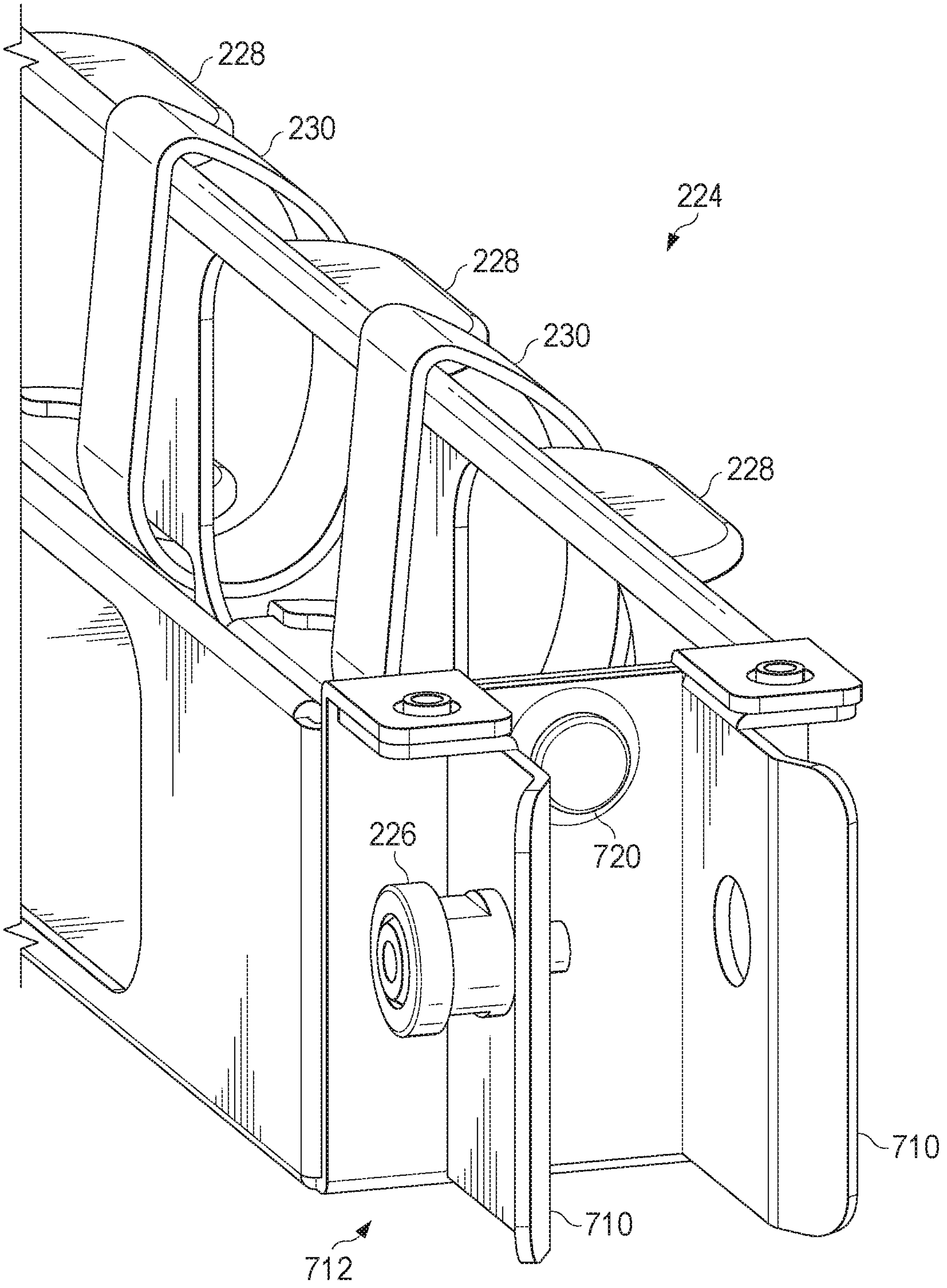

FIGS. 7A, 7B illustrates the cable management apparatus 224. The cable management apparatus 224 includes the plunger 226, the plurality of tabs 228, and the plurality of retention devices 230. The cable management apparatus 224 can be slideably coupled to the rail assembly 222, as shown in FIGS. 3 and 4. In some examples, the plunger 226 includes a spring. In some examples, the retention devices 230 are hook-and-loop members.

The cable management apparatus 224 can further include a pair of flanges 710 extending from a first end 712 of the cable management apparatus 224. The plunger 226 can be coupled thru one of the flanges of the pair of flanges 710. The cable management apparatus 224 can further include a coupling element 720 coupled to the first end 712 of the cable management apparatus 224 and extending away from the first end 712. The coupling element 720 can include a stub 722, shown in FIG. 8C. A gap can be defined between the stub 722 and the first end 712 of the cable management apparatus 224.

Figure 8A:
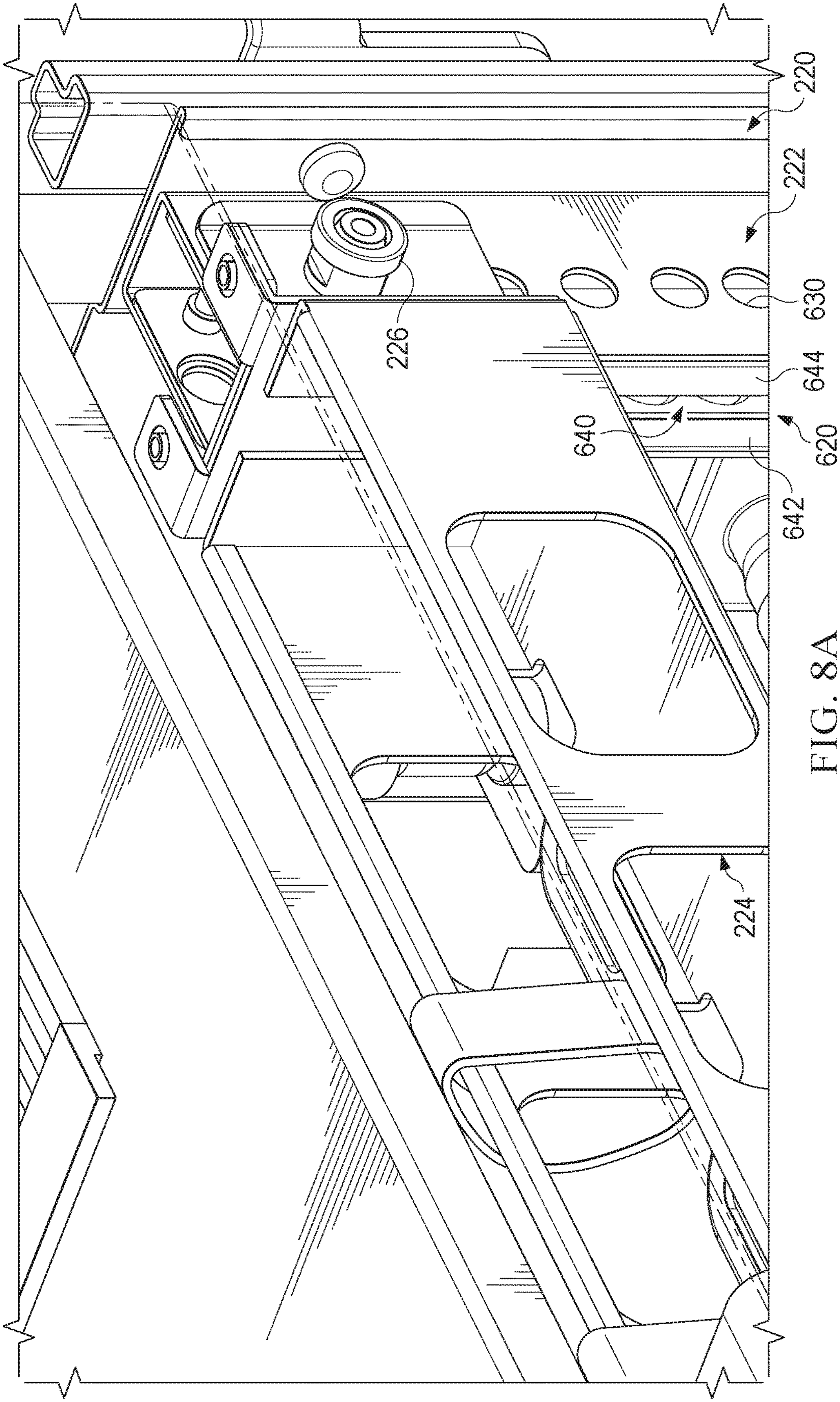
FIG. 8A illustrates a perspective view of the cable management apparatus coupled to the rail assembly.
Figure 8B:
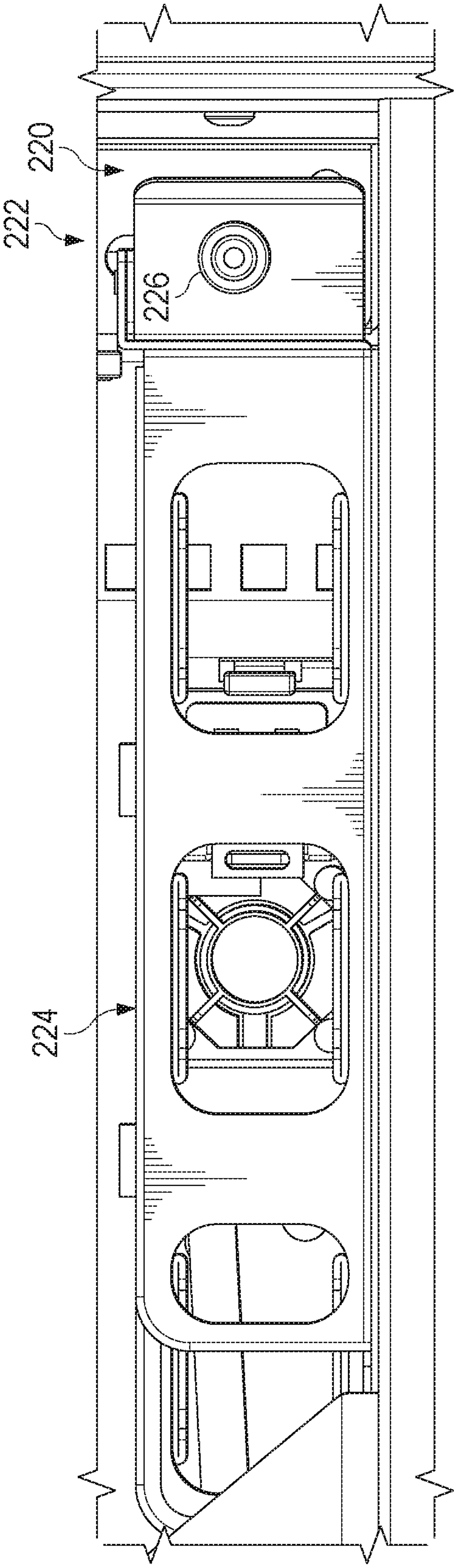
FIG. 8B illustrates a front view of the cable management apparatus coupled to the rail assembly.
Figure 8C:
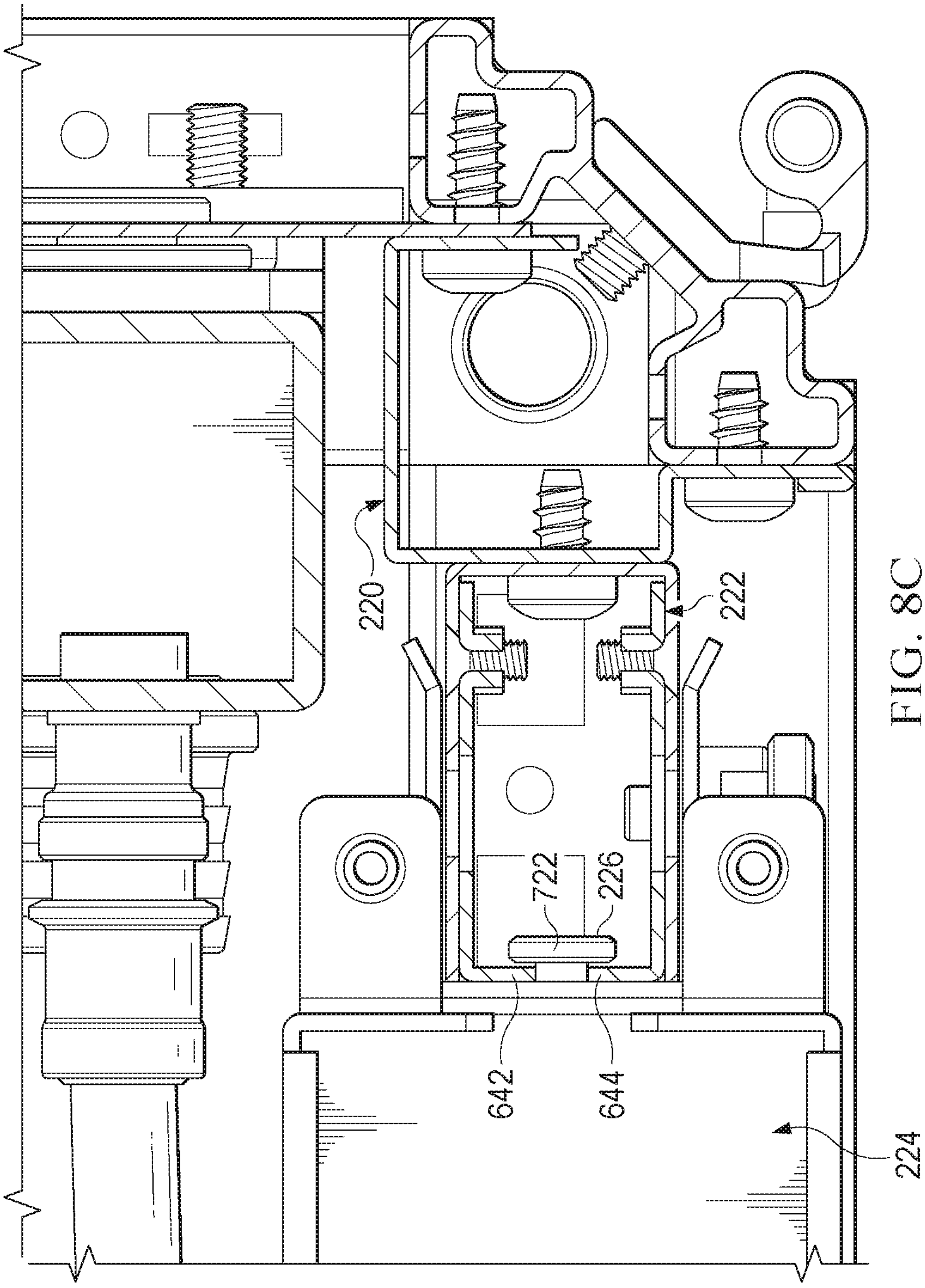
FIG. 8C illustrates a top down view of the cable management apparatus coupled to the rail assembly.
Figure 9:
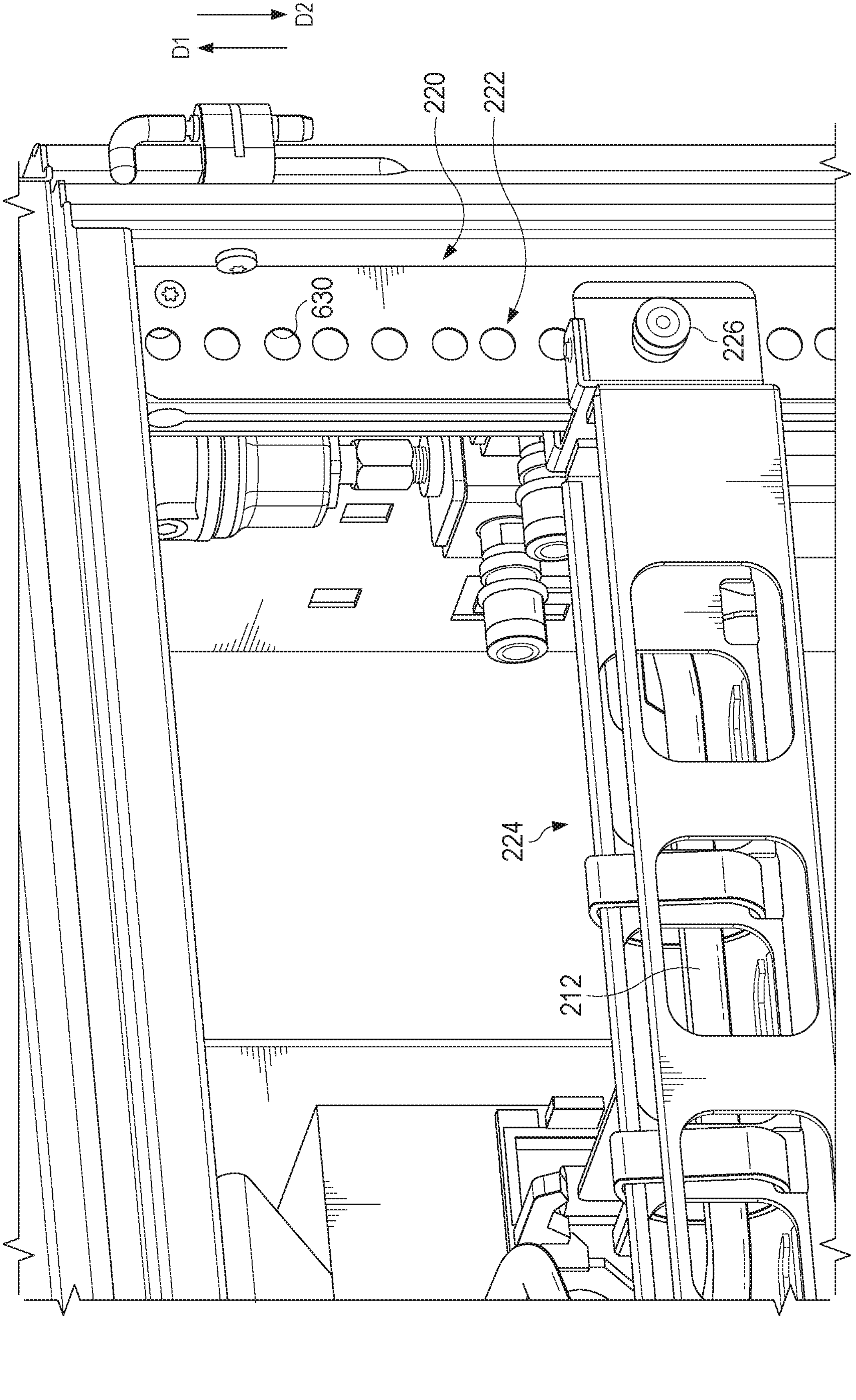
FIG. 9 illustrates the cable management apparatus coupled to the rail assembly.

FIG. 8A illustrates a perspective view of the cable management apparatus 224 coupled to the rail assembly 222; FIG. 8B illustrates a front view of the cable management apparatus 224 coupled to the rail assembly 222; and FIG. 8C illustrates a top down view of the cable management apparatus 224 coupled to the rail assembly 222. In particular, the cable management apparatus 224 can initially be coupled to the rail assembly 222 by inserting the coupling element 720 through the flared opening 646 (shown in FIG. 6). Specifically, when the coupling element 720 is inserted through the flared opening 646, the coupling element 720 is positioned within the slot 640 of the rail side 620 of the rail assembly 222 through the flared opening 646 such that a portion of the first segment 642 and a portion of the second segment 644 are positioned within the gap of the coupling element 720.

Further, when the cable management apparatus 224 is coupled to the rail assembly 222, the plunger 226 extends through one of the apertures 630 to define a position of the cable management apparatus 224 with respect to the rail assembly 222. That is, the cable management apparatus 224 can be translated along the rail assembly 222 along the directions D1 and/or D2, shown in FIG. 9, until a desired positioning of the cable management apparatus 224 is obtained with respect to the rail assembly 222 such that the plunger 226 extends through a particular aperture 630 that corresponds to the desired positioning. The plunger 226 may be adjusted by a user to "pull" the plunger 226 away from the rail assembly 222 such that the cable management apparatus 224 has clearance to translate along the rail assembly 222 as the plunger 226 is under a spring force.

Further, when the cable management apparatus 224 is coupled to the rail assembly 222, the flanges 710 can be positioned adjacent the first side 610 and the second side 612 of the rail assembly 222.

Figure 10:
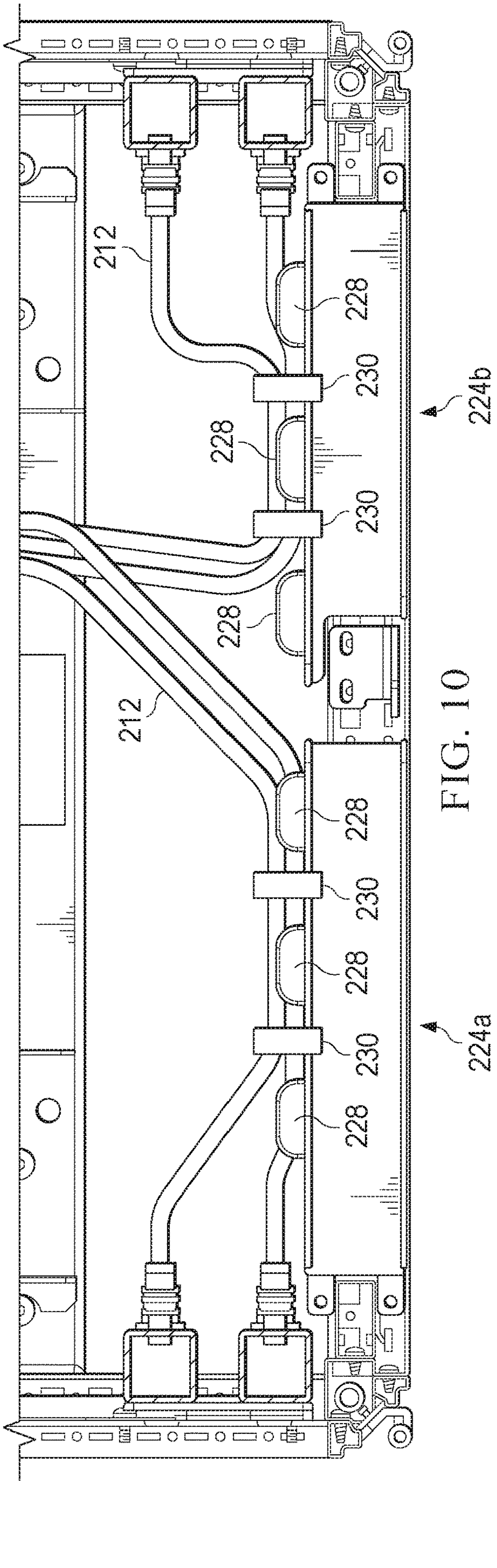
FIG. 10 illustrates a top down view of the cable management apparatuses coupled to the rail assembly
Figure 11:
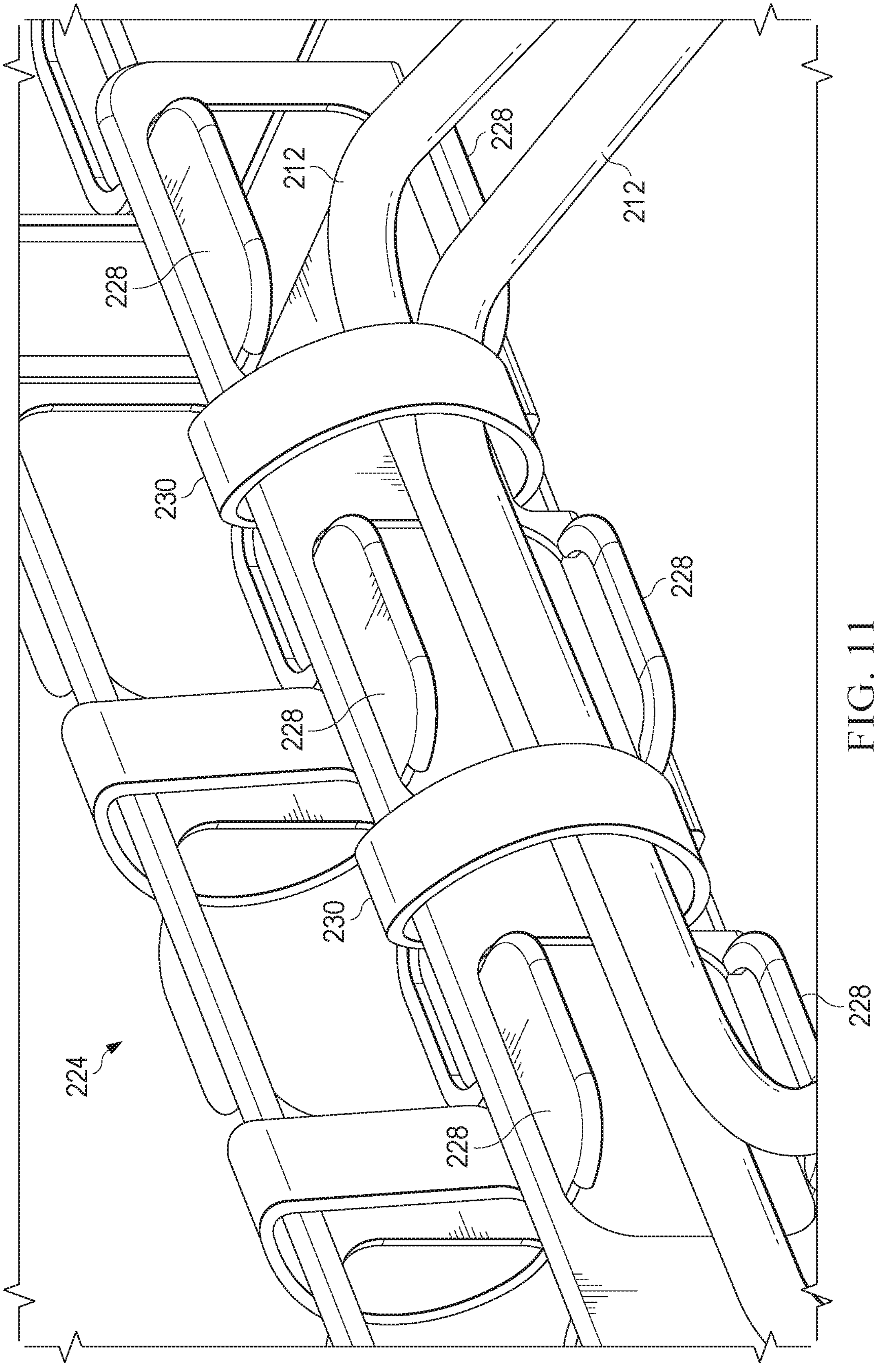
FIG. 11 illustrates a close up view of the cable management apparatus and cables.
Figure 12:
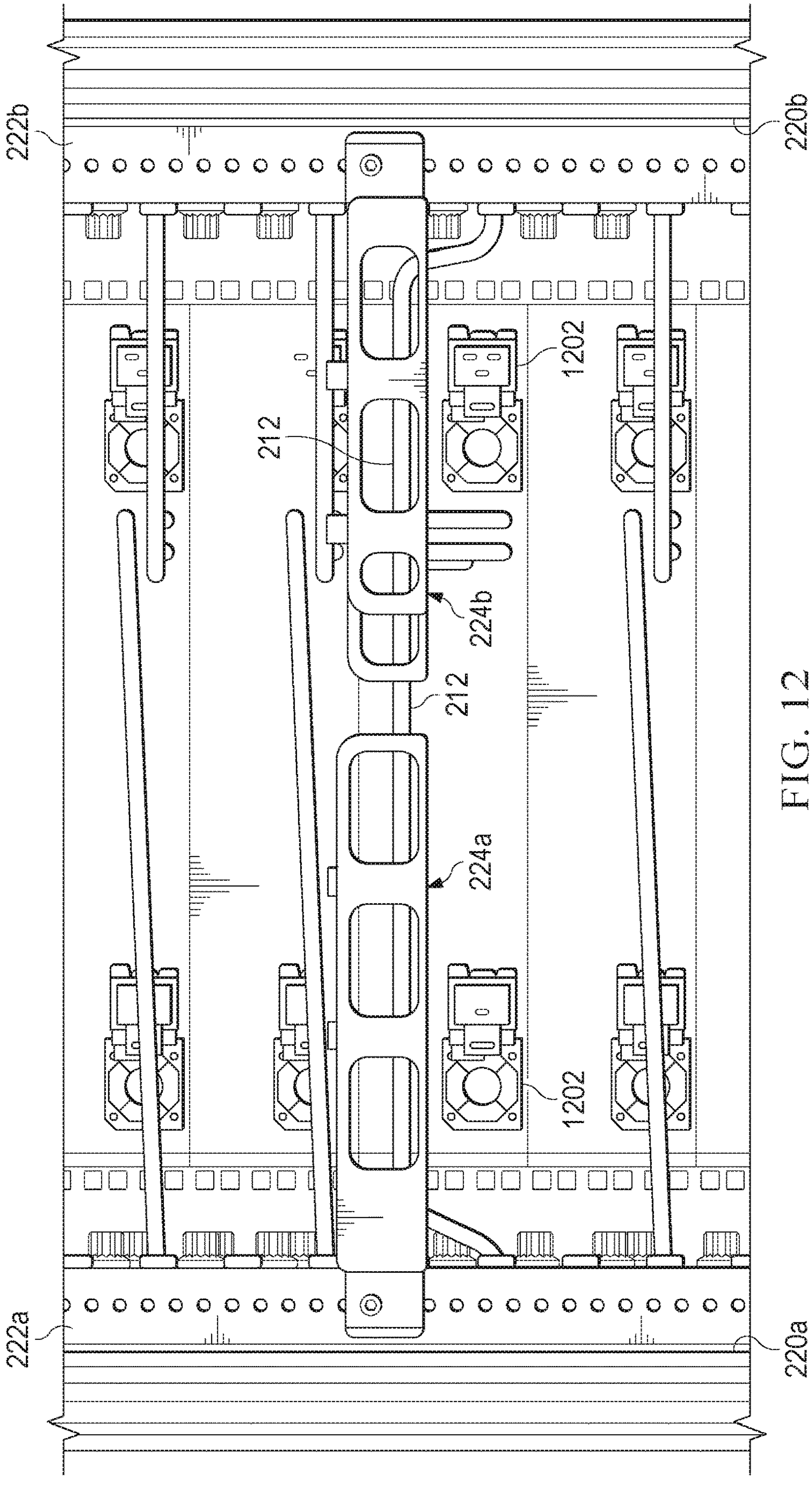
FIG. 12 illustrates a back view of the cable management apparatus coupled to the rail assembly.

FIG. 10 illustrates a top down view of the cable management apparatus 224*a*, 224*b* coupled to the rail assembly 222; FIG. 11 illustrates a close up view of the cable management apparatus 224 and cables 212; and FIG. 12 illustrates a back view of the cable management apparatus 224*a*, 224*b* coupled to the rail assembly 222. In particular, when the cable management apparatus 224 is coupled to the rail assembly 222, the position of the cable management apparatus 224 is defined with respect to the rail assembly 222 such that one or more of the cables 212 of the server rack 202 are positioned between opposing tabs 228 and coupled to the cable management apparatus 224 by the retention devices 230. As such, the tabs 228 and the retention devices 230 limit, and/or prevent, movement of the cables 212. That is, the tabs 228 and the retention devices 230 secure the location of the cables 212 on the back of the server rack 202, as shown in FIG. 12. As a result, other components of the server rack 202 are accessible, such as power supply units 1202 (e.g., for removal or installation of such).

In some examples, the cables 212 are hoses. In some examples, the cables 212 are thermal cooling hoses.

The cable management apparatus 224 can be decoupled from the rail assembly 222 by removing the plunger 226 from extending through the aperture 620, translating the cable management apparatus 224 along the rail assembly 222 until the coupling element 720 is positioned within the flared opening 626 or flared opening 648, and removing the cable management apparatus 224. The plunger 226 can be removed from being extended through the aperture by the user "pulling" the plunger 226 away from the rail assembly 222 to disengage the plunger 226 from the aperture 620.

In some examples, the position of each of the cable management apparatus 224*a*, 224*b* can be defined with respect to the rail assembly 222 to be substantially the same. That is, the cables 212 of the server rack 202 are positioned between opposing tabs 228 and coupled to the cable management apparatus 224 by the retention devices 230 of each of the cable management apparatus 224*a*, 224*b*, as shown in FIG. 12.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A cable management system for a server rack, comprising:
- an adapter bracket coupled to the server rack;
- a rail assembly coupled to the adapter bracket, the rail assembly including:
  - a first side positioned opposite to a second side, the first side including a plurality of apertures;
  - a top side including an opening;
  - a bottom side opposite to the top side, the bottom side including an additional opening;
  - a rail side, including:
    - a slot extending a length of the rail side and defining a first segment and a second segment on the rail side; and
    - an additional flared opening at the bottom side of the rail assembly;
- a cable management apparatus slideably coupled to the rail assembly, the cable management apparatus including:
  - a plunger;
  - a plurality of tabs; and
  - a plurality of retention devices,
  - wherein, when the cable management apparatus is coupled to the rail assembly, the plunger extends through one of the apertures to define a position of the cable management apparatus with respect to the rail assembly such that one or more cables of the server rack are positioned between opposing tabs of the plurality of tabs and coupled to the cable management apparatus by one or more of the retention devices;
- an additional adapter bracket coupled to the server rack;
- an additional rail assembly coupled to the additional adapter bracket, the additional rail assembly including a plurality of additional apertures;
- an additional cable management apparatus slideably coupled to the additional rail assembly, the additional cable management apparatus including:
  - an additional plunger;
  - a plurality of additional tabs; and
  - a plurality of additional retention devices, wherein, when the additional cable management apparatus is coupled to the additional rail assembly, the additional plunger extends through one of the additional apertures to define a position of the additional cable management apparatus with respect to the additional rail assembly such that the one or more cables of the server rack are positioned between opposing additional tabs of the plurality of additional tabs and coupled to the additional cable management apparatus by one or more of the additional retention devices.

2. The cable management system of claim 1, wherein the cable management apparatus further includes:

a pair of flanges extending from a first end of the cable management apparatus;

the plunger coupled thru a first flange of the pair of flanges; and a coupling element coupled to the first end of the cable management apparatus and extending away from the first end, the coupling element including a stub, wherein a gap is defined between the stub and the first end.

3. The cable management system of claim 2, wherein the slot of the rail side includes a flared opening at the top side of the rail assembly.

4. The cable management system of claim 3, wherein when the cable management apparatus is coupled to the rail assembly, i) the coupling element is positioned within the slot of the rail side of the rail assembly through the flared opening at the top side of the rail assembly such that a portion of the first segment and the second segment are positioned within the gap of the coupling element and ii) the plunger extends through one of the apertures to define the position of the cable management apparatus with respect to the rail assembly.

5. The cable management system of claim 1, wherein the rail assembly further includes a coupling side that is coupled to the adapter bracket, the coupling side opposite to the rail side.

6. The cable management system of claim 5, wherein the rail assembly includes a first member and a second member, the first member coupled to the second member, wherein the second member includes the rail side and the first member includes the coupling side.

7. The cable management system of claim 5, wherein both the first member and the second member include the plurality of apertures.

8. The cable management system of claim 1, wherein the retention devices includes hook-and-loop members.

9. The cable management system of claim 1, wherein the position of the cable management apparatus and the position of the additional cable management apparatus are substantially the same.

10. The cable management system of claim 1, wherein the one or more cables are hoses.

11. A cable management system for a server rack, comprising:

an adapter bracket coupled to the server rack;

a rail assembly coupled to the adapter bracket, the rail assembly including:

a first side positioned opposite to a second side, the first side including a plurality of apertures;

a top side including an opening;

a rail side, including a slot extending a length of the rail side and defining a first segment and a second segment on the rail side, the slot including a flared opening at the top side of the rail assembly; and a cable management apparatus slideably coupled to the rail assembly, the cable management apparatus including:

a plurality of tabs;

a plurality of retention devices;

a pair of flanges extending from a first end of the cable management apparatus;

a plunger coupled thru a first flange of the pair of flanges; and a coupling element coupled to the first end of the cable management apparatus and extending away from the first end, the coupling element including a stub, wherein a gap is defined between the stub and the first end;

wherein, when the cable management apparatus is coupled to the rail assembly, the plunger extends through one of the apertures to define a position of the cable management apparatus with respect to the rail assembly such that one or more cables of the server rack are positioned between opposing tabs of the plurality of tabs and coupled to the cable management apparatus by one or more of the retention devices;

an additional adapter bracket coupled to the server rack;

an additional rail assembly coupled to the additional adapter bracket, the additional rail assembly including a plurality of additional apertures;

an additional cable management apparatus slideably coupled to the additional rail assembly, the additional cable management apparatus including:

an additional plunger;

a plurality of additional tabs; and a plurality of additional retention devices, wherein, when the additional cable management apparatus is coupled to the additional rail assembly, the additional plunger extends through one of the additional apertures to define a position of the additional cable management apparatus with respect to the additional rail assembly such that the one or more cables of the server rack are positioned between opposing additional tabs of the plurality of additional tabs and coupled to the additional cable management apparatus by one or more of the additional retention devices.

12. The cable management system of claim 11, wherein when the cable management apparatus is coupled to the rail assembly, i) the coupling element is positioned within the slot of the rail side of the rail assembly through the flared opening at the top side of the rail assembly such that a portion of the first segment and the second segment are positioned within the gap of the coupling element and ii) the plunger extends through one of the apertures to define the position of the cable management apparatus with respect to the rail assembly.

13. The cable management system of claim 11, wherein the rail assembly further includes a coupling side that is coupled to the adapter bracket, the coupling side opposite to the rail side.

14. The cable management system of claim 13, wherein the rail assembly includes a first member and a second member, the first member coupled to the second member, wherein the second member includes the rail side and the first member includes the coupling side.

15. The cable management system of claim 13, wherein both the first member and the second member include the plurality of apertures.

16. The cable management system of claim 11, wherein the retention devices includes hook-and-loop members.

17. The cable management system of claim 11, wherein the rail assembly further includes a bottom side opposite to the top side, the bottom side including an additional opening, wherein the slot of the rail side includes an additional flared opening at the bottom side of the rail assembly.

18. The cable management system of claim 11, wherein the position of the cable management apparatus and the position of the additional cable management apparatus are substantially the same.

19. The cable management system of claim 1, wherein the one or more cables are hoses.

* * * * *